(12) United States Patent
Maruyama et al.

(10) Patent No.: US 8,604,352 B2
(45) Date of Patent: Dec. 10, 2013

(54) MULTILAYER CIRCUIT BOARD, INSULATING SHEET, AND SEMICONDUCTOR PACKAGE USING MULTILAYER CIRCUIT BOARD

(75) Inventors: Hironori Maruyama, Tokyo (JP); Hitoshi Kawaguchi, Tokyo (JP); Hiroyuki Tanaka, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 491 days.

(21) Appl. No.: 12/922,688

(22) PCT Filed: Mar. 25, 2009

(86) PCT No.: PCT/JP2009/001331
§ 371 (c)(1),
(2), (4) Date: Sep. 15, 2010

(87) PCT Pub. No.: WO2009/122680
PCT Pub. Date: Oct. 8, 2009

(65) Prior Publication Data
US 2011/0024172 A1    Feb. 3, 2011

(30) Foreign Application Priority Data
Mar. 31, 2008    (JP) .................................. 2008-092028

(51) Int. Cl.
*H05K 1/00*    (2006.01)
(52) U.S. Cl.
USPC ....................................................... 174/258
(58) Field of Classification Search
USPC ................................................ 174/255–259
See application file for complete search history.

(56) References Cited

U.S. PATENT DOCUMENTS

| | | | | |
|---|---|---|---|---|
| 6,423,905 | B1 * | 7/2002 | Brodsky et al. ................ | 174/256 |
| 7,655,871 | B2 * | 2/2010 | Arai et al. ...................... | 174/258 |
| 2007/0120249 | A1 | 5/2007 | Kawamoto | |
| 2009/0056995 | A1 * | 3/2009 | Maeda et al. .................. | 174/259 |

FOREIGN PATENT DOCUMENTS

| | | |
|---|---|---|
| JP | 11-233571 | 8/1999 |
| JP | 2004-281999 | 10/2004 |
| JP | 2005-286089 | 10/2005 |
| JP | 2006-24842 | 1/2006 |
| JP | 2007-059838 | 3/2007 |
| JP | 2007-149870 | 6/2007 |
| JP | 2008-037881 | 2/2008 |

OTHER PUBLICATIONS

International Search Report for International Application No. PCT/JP2009/001331, May 26, 2009.

* cited by examiner

*Primary Examiner* — Jeremy Norris
(74) *Attorney, Agent, or Firm* — Ditthavong Mori & Steiner, P.C.

(57) ABSTRACT

Semiconductor chip mounting yield and semiconductor package reliability deteriorate due to warpage of a multilayer circuit board. A multilayer circuit board (1) using an interlayer insulating layer (6) can suppress warpage of the entire multilayer circuit board (1) by making the interlayer insulating layer (6) serve as a buffer material. In the multilayer circuit board (1) using the interlayer insulating layer (6), conductor circuit layers (11) and interlayer insulating layers (6) are alternately arranged. The interlayer insulating layer (6) to be used in the multilayer circuit board (1) includes a first insulating layer and a second insulating layer having an elastic modulus higher than that of the first insulating layer.

17 Claims, 1 Drawing Sheet

MULTILAYER CIRCUIT BOARD, INSULATING SHEET, AND SEMICONDUCTOR PACKAGE USING MULTILAYER CIRCUIT BOARD

TECHNICAL FIELD

The present invention relates to a multilayer circuit board, an insulating sheet and a semiconductor package using a multilayer circuit board.

BACKGROUND ART

Recent requirements for higher functions and reduction in a weight and a size in electronics have accelerated high-density integration and high-density mounting of electronic components, and increasing size reduction of a semiconductor package used in these electronic devices.

Since there is a limit to size reduction in a conventional type semiconductor package using a lead frame, there have been recently proposed a ball grid array (BGA) in which a semiconductor chip is mounted on a circuit board and an area-mount type semiconductor package such as a chip scale package (CSP). In these semiconductor packages, a semiconductor chip mounted in BGA is connected to a circuit board by a known manner such as wire bonding, TAB (Tape Automated Bonding) and flip-chip (FC) bonding, and there have been frequently proposed BGA and CSP structures employing a flip-chip bonding system which is advantageous for size reduction of a semiconductor package.

It is believed that mounting by flip-chip bonding is advantageous in that a mounting area can be reduced in comparison with wire bonding. In addition, flip-chip mounting has a feature of good electric properties because of a short circuit wiring. Flip-chip mounting is particularly suitable for a mobile device circuit strongly required to be size-reduced and thinned and a high-frequency circuit in which electric properties are important.

An interposer (multilayer circuit board) used for connection of a semiconductor chip in flip-chip mounting generally has a core layer, a conductor circuit layer and an insulating layer. For addressing further high-density mounting and speeding-up of an operating frequency in terms of such a multilayer circuit board, there has been proposed a thin build-up interposer which address a high frequency by reducing a thickness of a core layer or employing a coreless structure without a core layer which uses, as an interposer, a laminate consisting of a resin having a wiring pattern to reduce the overall thickness of the interposer and thus to reduce a length of interlayer connection (see, for example, Patent Document No. 1).

In a flip-chip mounted semiconductor package, a gap between a semiconductor chip and a circuit board is generally filled with a resin composition for reinforcement (underfill) for ensuring reliability of a joint in a semiconductor chip, a circuit board and a metal bump. A thermosetting resin such as an epoxy resin has been widely used as an underfill material.

This semiconductor package is produced by placing the active face of a silicon chip facing a circuit board, electrically connecting the face to the circuit board via a conductive material and filling the gap between the silicon chip and the circuit board with a thermosetting resin composition, which is then cured. This thermosetting resin composition contains a linear aliphatic hydrocarbon compound having 10 or more and 30 or less carbon atoms which chemically attaches a thermosetting resin. Thus, a silicon chip can be removed at a low temperature with a small shear force without damage to the silicon chip or the circuit board while higher temperature cycle reliability is ensured (See, for example, Patent Document No. 2).

Patent Document Nos. 3 and 4 have described an interlayer insulating layer used for a multilayer printed wiring board. Patent Document No. 3 has described that copper foils are laminated via one prepreg. Patent Document No. 4 has described that copper foils are placed on both sides of piled prepregs and the laminated. In other words, interlayer insulating layers sandwiched by interconnections are resin layers made of an identical material.

Patent Document No. 1: Japanese published application No. 2006-24842.
Patent Document No. 2: Japanese published application No. 1999-233571.
Patent Document No. 3: Japanese published application No. 2007-59838.
Patent Document No. 4: Japanese published application No. 2008-37881.

DISCLOSURE OF THE INVENTION

However, the prior art described in the above Documents has room for improvement in the respects below.

In a multilayer circuit board before mounting a semiconductor chip, a conductor circuit layer has a linear expansion coefficient different from that of the insulating resin layer and the semiconductor-chip mounted side has a conductor circuit different from that in the opposite side. The use of different conductor circuits leads to difference in a restraint degree between the conductor circuit and the insulating resin, and smaller restraint leads to larger variation the difference in a linear expansion coefficient between the conductor circuit and the resin. As a result, when a variation difference in the rear surface causes warpage of the overall circuit board, a semiconductor chip mounting yield is significantly reduced and thus semiconductor package reliability may be lowered.

In brief, warpage is caused by a difference in a linear expansion coefficient between a conductor circuit and an interlayer insulating layer sandwiched by the conductor circuits in the prior art. Furthermore, the warpage tends to be determined in either a convex or a concave direction for each circuit board.

Furthermore, there is a problem that when a semiconductor chip is mounted, warpage is caused in the overall multilayer circuit board due to difference in a linear expansion coefficient between the semiconductor chip and the multilayer circuit board. Therefore, there is a problem that even when an identical multilayer circuit board is used, a warpage direction varies depending on the type of a semiconductor chip mounted.

When the present invention for solving the problems in the prior art in view of the above circumstances is particularly applied to a multilayer circuit board composed of a plurality of insulating resin layers having a different elastic modulus which intervene between circuit layers, an insulating resin layer having a lower elastic modulus acts as a buffer material, so that warpage between the circuit layers can be reduced. Thus, warpage of the overall multilayer circuit board can be prevented. Furthermore, even when a warpage direction in the multilayer circuit board varies depending on the type of the semiconductor chip mounted, the insulating resin layer having a lower elastic modulus can act as a buffer material to warpage in any direction, so that warpage of the overall multilayer circuit board can be prevented. As a result, a multilayer circuit board can be used independently of the type of a semiconductor chip.

An objective of the present invention is to provide a multilayer circuit board, an insulating sheet and a semiconductor package which allow for improvement of a semiconductor-chip mounting yield and semiconductor package reliability.

The above objective can be achieved by the following aspects of the present invention.

[1] A multilayer circuit board in which conductor circuit layers and interlayer insulating layers are alternately laminated, wherein said interlayer insulating layers comprise a first insulating layer and a second insulating layer having an elastic modulus higher than that of said first insulating layer.

[2] The multilayer circuit board as described in [1], wherein said multilayer circuit board comprises a plurality of said interlayer insulating layers; and said interlayer insulating layers have an identical elastic modulus.

[3] The multilayer circuit board as described in [2], wherein said interlayer insulating layers are laminated in an identical lamination structure.

[4] The multilayer circuit board as described in [3], wherein, said interlayer insulating layers are laminated in such a configuration that the first insulating layer, the second insulating layer and the first insulating layer are sequentially laminated.

[5] The multilayer circuit board as described in [1], wherein the multilayer circuit board comprises a plurality of said interlayer insulating layers; and said interlayer insulating layers are laminated in a lamination structure comprising a first interlayer insulating layer consisting of said first insulating layer, said second insulating layer and said first insulating layer which are sequentially laminated, and a second interlayer insulating layer consisting of said second insulating layers.

[6] The multilayer circuit board as described in any of [1] to [5], wherein said interlayer insulating layer is made of a resin composition comprising a cyanate resin.

[7] The multilayer circuit board as described in [6], wherein said cyanate resin is a novolac-type cyanate resin.

[8] The multilayer circuit board as described in any of [1] to [6], wherein said multilayer circuit board further comprises a core layer;

said interlayer insulating layers are laminated over and underneath said core layer; and said interlayer insulating layers being line-symmetric around said core layer are laminated in an identical lamination structure.

[9] The multilayer circuit board as described in any of [1] to [7], wherein when elastic moduli of said first insulating layer and said second insulating layer are Ea and Eb, respectively, (Eb/Ea)>3.

[10] The multilayer circuit board as described in any of [1] to [7], wherein when Eb is an elastic modulus of said second insulating layer as determined by dynamic viscoelastic measurement at a frequency of 10 Hz, (Eb)≥4 GPa.

[11] The multilayer circuit board as described in any of [1] to [8], wherein when Ea is an elastic modulus of said first insulating layer as determined by dynamic viscoelastic measurement at a frequency of 10 Hz, (Ea)≤2 GPa.

[12] An insulating sheet constituting an interlayer insulating layer used for a multilayer circuit board in which conductor circuit layers and said interlayer insulating layers are alternately laminated, wherein said interlayer insulating layer comprises a first insulating layer and a second insulating layer having an elastic modulus higher than that of said first insulating layer.

[13] The insulating sheet as described in [12], wherein said interlayer insulating layers are laminated in such a configuration that said first insulating layer, said second insulating layer and said first insulating layer are sequentially laminated.

[14] The insulating sheet as described in [12] or [13], wherein said interlayer insulating layer is made of a resin composition comprising a cyanate resin.

[15] The insulating sheet as described in [14], wherein said cyanate resin is a novolac-type cyanate resin.

[16] The insulating sheet as described in any of [12] to [14], wherein, when elastic moduli of said first insulating layer and said second insulating layer are Ea and Eb, respectively, (Eb/Ea)>3.

[17] The insulating sheet as described in any of [12] to [16], wherein when Eb is an elastic modulus of said second insulating layer as determined by dynamic viscoelastic measurement at a frequency of 10 Hz, (Eb)≥4 GPa.

[18] The insulating sheet as described in any of [12] to [17], wherein when Ea is an elastic modulus of said first insulating layer as determined by dynamic viscoelastic measurement at a frequency of 10 Hz, (Ea)≤2 GPa.

[19] A semiconductor package comprising the multilayer circuit board as described in any of [1] to [11].

In a multilayer circuit board, an insulating sheet and a semiconductor package having a multilayer circuit board according to the present invention, an interlayer insulating layer contains a first insulating layer and a second insulating layer having an elastic modulus higher than that of the first insulating layer, so that overall warpage of the multilayer circuit board can be minimized and thus a semiconductor chip mounting yield and semiconductor package reliability can be improved.

BRIEF DESCRIPTION OF THE DRAWINGS

The above objective and other objectives, features and advantages will be further understood with Document to suitable embodiments described below and the accompanying drawings.

BEST MODE FOR CARRYING OUT THE INVENTION

There will be detailed embodiments of a structure according to the present invention with Document to the drawings.

The present invention is, however, not limited to the multilayer circuit boards 1 in these embodiments.

<Multilayer Circuit Board 1>

Figure 1:
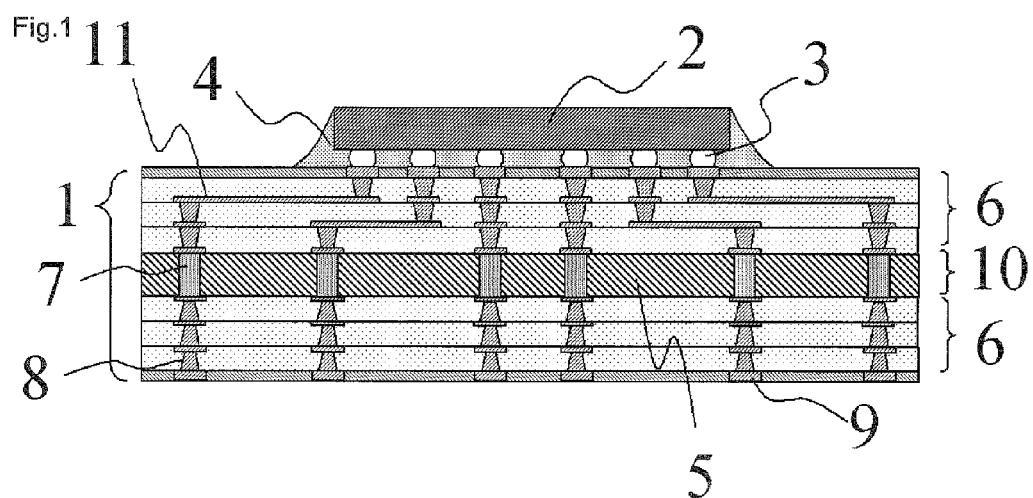
FIG. 1 is a schematic cross-sectional view illustrating an example of a semiconductor package structure of the present invention.

In FIG. 1, a multilayer circuit board 1 has conductor circuit layers 11 and interlayer insulating layer 6, which are alternately laminated, and is produced by building up the interlayer insulating layers 6 and the conductor circuit layers 11 over a core layer 5. The multilayer circuit board 1 has a configuration that over and underneath of the core layer 5 having an insulating layer and a conductor circuit layer in which a through-hole 7 is formed, the interlayer insulating layers 6 and the conductor circuit layers 11 are built up and a via is formed as a conductive component.

In the present invention, the interlayer insulating layer 6 used in the multilayer circuit board 1 having the conductor circuit layers 11 and the interlayer insulating layers 6 which are alternately laminated is an insulating sheet.

In this embodiment, elastic moduli of a first and a second insulating layers are(Ea) and (Eb), respectively, and an elastic modulus is determined by dynamic viscoelastic measurement at a frequency of 10 Hz.

As a feature, the interlayer insulating layer 6 is comprised of the first insulating layer and the second insulating layer which have a mutually different elastic modulus. In terms of elastic moduli of the first and the second insulating layers, an elastic modulus of the first insulating layer is preferably lower than that of the second insulating layer. The use of a plurality of insulating layers having a different elastic modulus allows warpage to be prevented in the overall multilayer circuit board 1.

Furthermore, in terms of elastic moduli of the first and the second insulating layers, there is preferably a relationship of (Eb/Ea)>3. Thus, the first insulating layer in the interlayer insulating layer 6 can act as a buffer material to prevent warpage in the overall multilayer circuit board 1.

An elastic modulus (Ea) of the first insulating layer is $\leq 2$ GPa, more preferably $\leq 1$ GPa. Thus, the layer can further effectively act as a buffer material for reducing warpage in the overall multilayer circuit board 1. Meanwhile, an elastic modulus (Eb) of the second insulating layer is $\geq 4$ GPa, more preferably $\geq 5$ GPa. Thus, warpage can be further reduced.

A glass transition temperature of the cured second insulating layer is 170° C. or higher, and a linear expansion coefficient in an in-plane direction at glass transition temperature or lower is 40 ppm/° C. or less. Here, a linear expansion coefficient in an in-plane direction can be determined, for example, using a TMA apparatus (TA Instruments) at a temperature programming rate of 10° C./min. If a linear expansion coefficient of the cured second insulating layer is more than 40 ppm/° C., it is twice or more as large as a linear expansion coefficient of copper (17 to 18 ppm/° C.) generally used for a circuit, causing significantly large warpage. A linear expansion coefficient at a glass transition temperature or lower is preferably 10 to 35 ppm/° C., more preferably 15 to 30 ppm/° C.

In particular, when a thickness of the multilayer circuit board 1 is as small as 0.5 mm or less, the first insulating layer reduces distortion due to a difference in a linear expansion coefficient, resulting in improvement in handling properties and processability in manufacturing a semiconductor package.

A thickness of the interlayer insulating layer 6 is 10 to 60 μm, preferably 20 to 50 μm. Particularly preferably, a thickness of the first insulating layer is 3 to 20 μm and a thickness of the second insulating layer is 10 to 50 μm.

A conductor circuit layer 11 can be made of any conductive metal with no particular restrictions, preferably copper or a copper alloy, and is patterned in a desired circuit structure. The conductor circuit layer in the core layer 5 is typically formed by patterning a core material with a copper foil by a subtractive process, while the conductor circuit layer over the interlayer insulating layer 6 is typically formed by patterning using a semi-additive or full-additive process.

A thickness of the core layer 5 is preferably 500 μm or less, more preferably 50 μm to 400 μm. The multilayer circuit board 1 has the core layer 5 and, for example, 2 to 10 conductor circuit layers 11 and interlayer insulating layers 6. Preferably, it has 2 to 6 conductor circuit layers 11 and interlayer insulating layers 6.

On the outer layer surface of the multilayer circuit board 1, a heat resistant coating layer such as a solder resist can be formed for the purpose of, for example, protecting a conductor and ensuring insulation.

<Core Layer 5>

A material used for the insulating layer in the core layer 5 in the multilayer circuit board 1 can be any material having suitable strength; an example which can be suitably used may be, but not limited to, a plate material (so-called prepreg) prepared by impregnating a fiber base (for example, a glass fiber sheet) with a resin composition containing at least one or two or more of epoxy resins, phenol resins, cyanate resins, triazine resins, bismaleimide resins, polyimide resins, polyamide-imide resins and benzocyclobutene resins and semi-curing the product. Particularly preferred is a plate material (so-called prepreg) prepared by impregnating a fiber base (for example, a glass fiber sheet) with a resin composition containing a cyanate resin, a phenol resin, an epoxy resin and an inorganic filler and semi-curing the product.

<Interlayer Insulating Layer 6>

In the multilayer circuit board 1, there are no particular restrictions to a material for the first and the second insulating layers in the interlayer insulating layer as long as the cured first and second insulating layers described above meet the requirements for a glass transition temperature, an elastic modulus and a linear expansion coefficient and have proper strength; preferably, the material is a resin composition containing a thermosetting resin. Thus, heat resistance of the interlayer insulating layer 6 can be improved. A fiber base such as a glass fiber sheet can be impregnated with a resin composition used for the second insulating layer in the interlayer insulating layer 6, or a resin composition per se can be cured. There are no particular restrictions to a method for impregnating a fiber base with a resin composition. Furthermore, the interlayer insulating layer 6 with a carrier base is prepared by forming the interlayer insulating layer 6 made of the above resin composition on the carrier base.

Examples of the above thermosetting resin include epoxy resins, phenol resins, cyanate resins, triazine resin, bismaleimide resin, polyimide resin, polyamide-imide resin, benzocyclobutene resin, benzoxazine-ring containing resins, urea resins, triazine-ring containing resins such as melamine resins, unsaturated polyester resins, polyurethane resins, diallyl phthalate resins and silicone resins.

One of these can be used alone; two or more having a different weight average molecular weight can be combined; or alternatively, one or more of these can be combined with prepolymer(s) thereof.

The thermosetting resin preferably contains at least one or two or more of epoxy resins, phenol resins, cyanate resins, triazine resins, bismaleimide resins, polyimide resins, polyamide-imide resins, benzocyclobutene resins and benzoxazine-ring containing resins.

Examples of the above epoxy resin include bisphenol type epoxy resins such as bisphenol-A epoxy resins, bisphenol-F epoxy resins, bisphenol-E type epoxy resins, bisphenol-S type epoxy resins, bisphenol-Z type epoxy resins, bisphenol-P type epoxy resins and bisphenol-M type epoxy resins; novolac type epoxy resins such as phenol-novolac type epoxy resin and cresol-novolac epoxy resins; and epoxy resins such as biphenyl type epoxy resins, biphenylaralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins and fluorene type epoxy resins.

Examples of the above phenol resin include novolac type phenol resins such as phenol novolac resins, cresol novolac resins and bisphenol-A novolac resins; unmodified resol phenol resins; and resol type phenol resins such as oil-modified resol phenol resins modified by an oil such as wood oil, linseed oil and walnut oil.

Among these, a cyanate resin (including a prepolymer of a cyanate resin) is particularly preferable. Thus, a linear expansion coefficient of the interlayer insulating layer 6 can be reduced. Furthermore, electric properties (a low dielectric constant and a low dielectric tangent) and mechanical strength of the interlayer insulating layer 6 are improved.

The above cyanate resin can be prepared by, for example, reacting a halogenated cyan compound with a phenol derivative with, if necessary, heating to form a prepolymer. Specific examples include novolac type cyanate resins and bisphenol type cyanate resins such as bisphenol-A type cyanate resins, bisphenol-E type cyanate resins and tetramethylbisphenol-F type cyanate resins. Among these, novolac type cyanate resins are preferable. Thus, heat resistance can be improved and flame resistance of a resin composition or the like can be improved owing to an increased crosslink density. It is because a novolac type cyanate resin forms a triazine ring after the curing reaction. Furthermore, it would be because a novolac type cyanate resin tends to be carbonized due to its higher proportion of benzene rings in the structure.

The above novolac type cyanate resin can be, for example, a compound represented by formula (1).

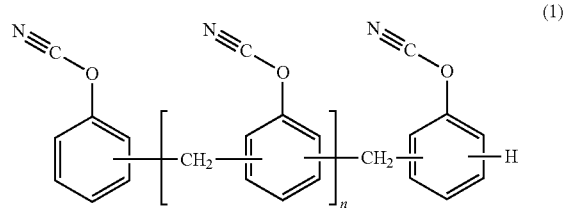

(1)

The average number "n" of a repeating unit in the novolac type cyanate resin is preferably, but not limited to, 1 to 10, particularly preferably 2 to 7. If the average number "n" of the repeating unit is less than the above lower limit, the novolac type cyanate resin tends to be crystallized and thus to be less soluble in a generally-used solvent, sometimes leading to difficulty in handling. If the average number "n" of the repeating unit is more than the above upper limit, a melt viscosity is so increased that the interlayer insulating layer 6 may be less moldable.

A weight average molecular weight of the above cyanate resin is preferably, but not limited to, 500 to 4,500, particularly preferably 600 to 3,000. If the weight average molecular weight is less than the lower limit, mechanical strength of the cured interlayer insulating layer 6 may be deteriorated and, when the interlayer insulating layer 6 is prepared, it may be tacky, leading to resin transfer. If the weight average molecular weight is more than the upper limit, a curing reaction is so accelerated that when it is formed into a substrate (particularly, a circuit board), molding may be defective or interlayer peeling strength may be deteriorated.

A weight average molecular weight of the cyanate resin or the like can be determined by, for example, GPC (Gel Permeation Chromatography, converted into polystyrene as a standard).

The above cyanate resin including its derivative can be used, but not limited to, alone, in combination of two or more having a different weight average molecular weight, or alternatively alone or in combination of two or more together with prepolymer(s) thereof.

A content of the above thermosetting resin is preferably, but not limited to, 5 to 50% by weight, particularly preferably 10 to 40% by weight to the total amount of the resin composition. If the content is less than the lower limit, formation of the interlayer insulating layer 6 may be difficult, while if it is more than the upper limit, strength of the interlayer insulating layer 6 may be deteriorated.

When a cyanate resin (particularly, a novolac type cyanate resin) is used as the above thermosetting resin, it is preferably used in combination with an epoxy resin (substantially halogen free).

Examples of the above epoxy resin include bisphenol type epoxy resins such as bisphenol-A epoxy resins, bisphenol-F epoxy resins, bisphenol-E type epoxy resins, bisphenol-S type epoxy resins, bisphenol-Z type epoxy resins, bisphenol-P type epoxy resins and bisphenol-M type epoxy resins; novolac type epoxy resins such as phenol novolac type epoxy resins and cresol novolac epoxy resins; arylalkylene type epoxy resins such as biphenyl type epoxy resins, xylylene type epoxy resins and biphenylaralkyl type epoxy resins; naphthalene type epoxy resins; anthracene type epoxy resins; phenoxy type epoxy resins; dicyclopentadiene type epoxy resins; norbornene type epoxy resins; adamantane type epoxy resins; and fluorene type epoxy resins.

As the above epoxy resin, one of these can be used alone; two or more having a different weight average molecular weight can be combined; or alternatively, one or more of these can be combined with prepolymer(s) thereof.

Among these epoxy resins, arylalkylene type epoxy resins are particularly preferable. Thus, hygroscopic solder heat resistance and flame resistance can be improved.

The above arylalkylene type epoxy resin refers to an epoxy resin having one or more arylalkylene group in a repeating unit. Examples include xylylene type epoxy resins and biphenyldimethylene type epoxy resins. Among these, biphenyldimethylene type epoxy resins are preferable. A biphenyldimethylene type epoxy resin can be, for example, represented by formula (2).

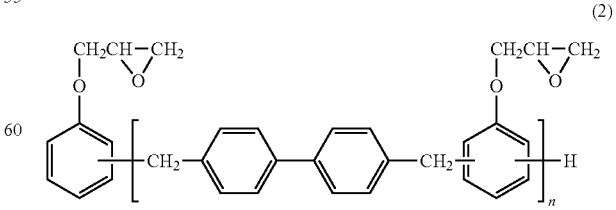

(2)

An average number "n" of the repeating unit in the biphenyldimethylene type epoxy resin represented by formula (2) is preferably, but not limited to, 1 to 10, particularly preferably 2 to 5. If the average number "n" of the repeating unit is less than the lower limit, the biphenyldimethylene type epoxy resin tends to be crystallized and thus to be less soluble in a generally-used solvent, sometimes leading to difficulty in handling.

If the average number "n" of the repeating unit is more than the above upper limit, resin flowability may be decreased, causing defective molding. With an average number "n" of the repeating unit within the above range, these properties can be well balanced.

A content of the above epoxy resin is preferably, but not limited to, 1 to 55% by weight, particularly preferably 5 to 40% by weight to the total amount of the resin composition. If the content is less than the lower limit, the cyanate resin may be less reactive or a product obtained may be less moisture-resistant, while if it is more than the upper limit, linear-expansion resistance or heat resistance may be deteriorated.

A weight average molecular weight of the above epoxy resin is preferably, but not limited to, 500 to 20,000, particularly preferably 800 to 15,000. If the weight average molecular weight is less than the lower limit, the surface of the interlayer insulating layer 6 may be tacky, while if it is more than the upper limit, solder heat resistance may be deteriorated. With a weight average molecular weight within the above range, these properties can be well balanced.

A weight average molecular weight of the above epoxy resin can be determined by, for example, GPC.

The above resin composition preferably contains a film-forming resin. It can further improve film-formability and handling properties in producing the interlayer insulating layer 6 with a carrier base. Examples of the above film-forming resin include phenoxy resins, bisphenol-F resins and olefin resins.

The above film-forming resin including its derivative can be used alone, in combination of two or more having a different weight average molecular weight, or alternatively alone or in combination of two or more together with pre-polymer(s) thereof. Among these, phenoxy resins are preferable. Thus, heat resistance and flame resistance can be improved.

Examples of the above phenoxy resin include, but not limited to, phenoxy resins having a bisphenol moiety such as phenoxy resins having a bisphenol-A moiety, phenoxy resins having a bisphenol-F moiety, phenoxy resins having a bisphenol-S moiety, phenoxy resins having a bisphenol-M moiety, phenoxy resins having a bisphenol-P moiety and phenoxy resins having a bisphenol-Z moiety; phenoxy resins having a novolac moiety; phenoxy resins having an anthracene moiety; phenoxy resins having a fluorene moiety; phenoxy resins having a dicyclopentadiene moiety; phenoxy resins having a norbornene moiety; phenoxy resins having a naphthalene moiety; phenoxy resins having a biphenyl moiety; and phenoxy resins having an adamantane moiety.

Alternatively, the above phenoxy resin can have a structure having two or more of the above moieties, or a phenoxy resins containing these moieties in different proportions can be used. Furthermore, a plurality of phenoxy resins having a different moiety can be used, a plurality of phenoxy resins having a different weight average molecular weight can be used, or the resins can be combined with their prepolymers.

Among these, a phenoxy resin having a biphenyl and a bisphenol-S moieties can be used. Thus, rigidity of the biphenyl moiety can contribute to increase a glass transition temperature and the bisphenol-S moiety can improve adhesiveness of a plated metal in producing the multilayer circuit board 1.

Alternatively, a phenoxy resin having a bisphenol-A and a bisphenol-F moieties can be used. Thus, its adhesiveness to an inner circuit board in producing the multilayer circuit board 1 can be improved. Furthermore, the phenoxy resin having a biphenyl and a bisphenol-S moieties can be combined with the phenoxy resin having a bisphenol-A and a bisphenol-F moieties.

A molecular weight of the above film-forming resin is preferably, but not limited to, 1,000 to 100,000 as a weight average molecular weight. It is further preferably 10,000 to 60,000.

If a weight average molecular weight of a film-forming resin is less than the lower limit, film formability may be inadequately improved. If it is more than the upper limit, a film-forming resin may become less soluble. With a film-forming resin having a weight average molecular weight within the above range, these properties will be well balanced.

A content of the film-forming resin is preferably, but not limited to, 1 to 40% by weight to the total amount of the resin composition. It is further preferably 5 to 30% by weight. If a content of the film-forming resin is less than the lower limit, film formability may be inadequately improved. If it is more than the upper limit, a content of the cyanate resin is relatively reduced, so that linear expansion may be inadequately reduced. With a content of the film-forming resin within the above range, these properties can be well balanced.

Both thermosetting resin and film-forming resin used for the interlayer insulating layer 6 are substantially halogen-free. Thus, the layer can be made flame resistant without using a halogen-containing compound. The phrase, "substantially halogen-free" as used herein, means that, for example, a halogen content in an epoxy resin or phenoxy resin is 0.15% by weight or less (JPCA-ES01-2003).

The above resin composition can, if necessary, contain a curing accelerator. The curing accelerator can be a known compound. Examples include imidazole compounds; organic metal salts such as zinc naphthenate, cobalt naphthenate, tin octylate, cobalt octylate, bis(acetylacetonato)cobalt (II) and tris(acetylacetonato)cobalt (III); tertiary amines such as triethylamine, tributylamine and diazabicyclo[2,2,2]octane; phenol compounds such as phenol, bisphenol-A and non-ylphenol; organic acids such as acetic acid, benzoic acid, salicylic acid and p-toluenesulfonic acid; and a mixture thereof. These curing accelerators including their derivatives can be used alone or in combination of two or more.

Among these curing accelerators, an imidazole compounds is particularly preferable. It can improve hygroscopic solder heat resistance. The imidazole compound is desirably compatible to, but not limited to, the cyanate resin, the epoxy resin and the film-forming resin components described above.

The phrase, "compatible to the cyanate resin, the epoxy resin and the film-forming resin components described above" as used herein, means that when an imidazole compound is mixed with the cyanate resin, the epoxy resin and the film-forming resin components described above or when an imidazole compound is mixed with the cyanate resin, the epoxy resin and the film-forming resin components described above, the imidazole compound can be dissolved in a substantially molecular level or dispersed in a considerably equivalent level.

Examples of the imidazole compound in a resin composition for the interlayer insulating layer 6 include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino- 6-(2'-undecylimidazolyl)-ethyl-s-triazine, 2,4-diamino-6-[2'-ethyl-4-methylimidazolyl-(1')]-ethyl-s-triazine, 2-phenyl-4,5-dihydroxymethylimidazole, and 2-phenyl-4-methyl-5-hydroxymethylimidazole.

Among these, the imidazole compound is preferably selected from 1-benzyl-2-methylimidazole, 1-benzyl-2-phenylimidazole and 2-ethyl-4-methylimidazole. These imidazole compounds exhibits particularly excellent compatibility to provide a highly uniform cured product, so that a fine conductor circuit can be easily formed and a multilayer circuit board 1 can exhibit higher heat resistance. By using such an imidazole compound, a reaction of the cyanate resin or the epoxy resin can be effectively accelerated and even when a content of the imidazole compound is reduced, equivalent properties can be provided.

Furthermore, a resin composition containing such an imidazole compound can be cured in higher uniformity from a fine matrix unit with the resin components. Thus, the interlayer insulating layer 6 formed over the multilayer circuit board 1 can exhibit improved insulation performance and heat resistance.

A content of the above imidazole compound is preferably, but not limited to, 0.01 to 5% by weight, particularly preferably 0.05 to 3% by weight to the total amount of the cyanate resin and the epoxy resin. Thus, in particular, heat resistance can be improved.

The above resin composition preferably contains an inorganic filler. Thus, linear-expansion resistance and flame resistance can be improved. A combination of the above cyanate resin and/or its prepolymer (particularly, a novolac type cyanate resin) with the inorganic filler can improve an elastic modulus.

Examples of the above inorganic filler include silicates such as talc, calcined clay, noncalcined clay, mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates and sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanates such as strontium titanate and barium titanate. These inorganic fillers can be used alone or in combination of two or more. Among these, silica is preferable and fused silica (particularly, spherical fused silica) is preferable in the light of its excellent linear-expansion resistance. It can have a crushed or spherical shape, which can be selected depending on its intended application; for example, spherical silica is used for reducing a melt viscosity of the resin composition for ensuring impregnating property into a fiber base.

An average particle size of the above inorganic filler is preferably, but not limited to, 0.01 to 5 μm. It is further preferably 0.1 to 2 μm.

If an average particle size of the above inorganic filler is less than the lower limit, then in preparing a resin varnish using a resin composition of the present invention, the resin varnish becomes so viscous that workability in producing the interlayer insulating layer 6 with a carrier base maybe adversely affected. If it is more than the upper limit, an undesired event such as sedimentation of the inorganic filler in the resin varnish may occur. With the inorganic filler having an average particle size within the above range, these properties can be well balanced.

The above inorganic filler can be, but not limited to, an inorganic filler having a monodisperse or polydisperse average particle size. Inorganic fillers having a monodisperse average particle size and/or a polydisperse average particle size can be used alone or in combination of two or more.

A content of the above inorganic filler is preferably, but not limited to, 20 to 70% by weight to the total amount of the resin composition. It is further preferably 30 to 60% by weight. If a content of the inorganic filler is less than the lower limit, thermal expansion or water absorbability can be insufficiently reduced. It it is more than the upper limit, fluidity of the resin composition is so lowered that the interlayer insulating layer 6 can be less moldable. With a content of the inorganic filler within the above range, these properties can be well balanced.

The above resin composition preferably contains, but not limited to, a coupling agent. The coupling agent can improve wettability in an interface between the above thermosetting resin and the inorganic filler to improve heat resistance, particularly hygroscopic solder heat resistance.

The above coupling agent can be any common coupling agent, and specifically, it is preferable to use one or more coupling agents selected from epoxy silane coupling agents, cationic silane coupling agents, aminosilane coupling agents, titanate coupling agents and silicone oil type coupling agents. Thus, wettability in an interface with the inorganic filler can be increased, resulting in further improvement of heat resistance.

A content of the above coupling agent is preferably, but not limited to, 0.05 to 3 parts by weight to 100 parts by weight of the inorganic filler. If a content of the coupling agent is less than the lower limit, coating of the inorganic filler may be insufficiently effective in improving heat resistance. If it is more than the upper limit, bending strength of the interlayer insulating layer 6 may be deteriorated. With a content of the coupling agent within the above range, these properties can be well balanced.

The resin composition can further contain a thermoplastic resin such as phenoxy resins, polyimide resins, polyamide-imide resins, polyphenylene oxide resins, polyether sulfone resins, polyester resins, polyethylene resins and polystyrene resins; a thermoplastic elastomer such as polystyrene thermoplastic elastomers (for example, styrene-butadiene copolymers and styrene-isoprene copolymers), polyolefin thermoplastic elastomers, polyamide elastomers and polyester elastomers; and/or a diene elastomer such as polybutadienes, epoxy-modified polybutadienes, acryl-modified polybutadienes and methacryl-modified polybutadienes.

The above resin composition can, if necessary, contain additives other than the components described above, including a pigment, a dye, a defoamer, a leveling agent, an ultraviolet absorber, a foaming agent, an antioxidant, a flame retardant and an ion scavenger.

The resin composition can be applied to a carrier base by, but not limited to, a method containing the steps of dissolving or dispersing the resin composition in a solvent to prepare a resin varnish, applying the resin varnish on a carrier base using any of various coaters and then drying the varnish; or a method containing the steps of spraying the resin varnish to a carrier base using a spraying device and then drying the varnish.

Among these, the method having the steps of applying a resin varnish on a carrier base using an any appropriate coater such as a comma coater and a die coater and then drying the varnish. Thus, an interlayer insulating layer 6 with a carrier base which is void-free and has a uniform thickness of the interlayer insulating layer 6 can be efficiently produced.

Examples of the carrier base can include, but not limited to, polyester resins such as polyethylene terephthalate and polybutylene terephthalate; heat resistant thermoplastic resin films such as fluororesins and polyimide resins; and metal foils such as copper and/or copper alloys, aluminum and/or aluminum alloys, iron and/or iron alloys, silver and/or silver alloys, gold and gold alloys, zinc and zinc alloys, nickel and nickel alloys and tin and tin alloys.

There are no particular restrictions to a thickness of the above carrier base, but it is preferably 10 to 100 μm because handling properties can be improved during producing the interlayer insulating layer 6 with a carrier base.

The solvent used for the above resin varnish is desirably a solvent having higher ability of dissolving the resin components in the above resin composition, but a poor solvent can be used as long as it does not adversely affect the system. Examples of a solvent having higher dissolving ability can include acetone, methyl ethyl ketone, methyl isobutyl ketone, cyclohexanone, tetrahydrofuran, dimethylformamide, dimethylacetamide, dimethyl sulfoxide, ethylene glycol, cellosolves and carbitols.

A solid content in the above resin varnish is preferably, but not limited to, 30 to 80% by weight, particularly preferably 40 to 70% by weight.

Then, the interlayer insulating layer 6 formed from such a resin composition can be surface-roughened with an oxidizing agent such as a permanganate and a bichromate and thus, a number of highly uniform fine bumps in the surface of the interlayer insulating layer 6 after the roughening.

When the surface of the interlayer insulating layer 6 after the roughening is metal-plated, a fine conductor circuit can be precisely formed due to higher flatness of the roughened surface. Furthermore, the fine bumps can improve an anchor effect, resulting in higher adhesiveness between the interlayer insulating layer 6 and the plated metal.

Interlayer insulating layers 6 having a different elastic modulus can be prepared by any appropriate process; for example, interlayer insulating layers 6 having a different elastic modulus are separately prepared and then laminated when the interlayer insulating layer 6 in the multilayer circuit board 1 is produced, or alternatively interlayer insulating layers 6 having a different elastic modulus are laminated as one interlayer insulating layer 6 before producing a multilayer circuit board 1, but the method is not limited to these.

The interlayer insulating layers 6 are laminated preferably in a two or more layer structure, particularly preferably in a three layer structure. When the interlayer insulating layer 6 has a three layer structure, exemplary structures include a configuration that a first insulating layer, a second insulating layer and a first insulating layer are laminated in sequence, or a configuration that a first insulating layer, a second insulating layer and a different type of first insulating layer from the preceding first insulating layer are laminated in sequence.

<Process for Manufacturing a Multilayer Circuit Board 1>

After a through-hole 7 is formed in the material used for the above core layer 5, the surface including the inside of the through-hole 7 is, for example, copper-plated to form a conductor layer with a desired pattern and thus an inner circuit board 10 is produced. The inner circuit board 10 itself can be a multilayer circuit board having insulating layers and conductor circuit layers.

FIG. 1 shows a multilayer circuit board 1 having a structure that on both sides of the inner circuit board 10, three conductor circuit layers 11 and three interlayer insulating layers 6 are laminated, respectively.

In the plurality of the interlayer insulating layers 6 in the multilayer circuit board 1, at least one interlayer insulating layer 6 has a first insulating layer and a second insulating layer, in which an elastic modulus of the first insulating layer is lower than that of the second insulating layer. Thus, the first insulating layer acts as a buffer material, so that warpage of the overall multilayer circuit board 1 can be prevented. Furthermore, even when a warpage direction in the multilayer circuit board varies depending on the type of the semiconductor chip 2 mounted, the insulating resin layer having a lower elastic modulus can act as a buffer material to warpage in any direction because the first insulating layer has a lower elastic modulus than the second insulating layer, and therefore, warpage of the overall multilayer circuit board 1 can be prevented. As a result, a multilayer circuit board 1 can be used independently of the type of a semiconductor chip.

Figure 2:
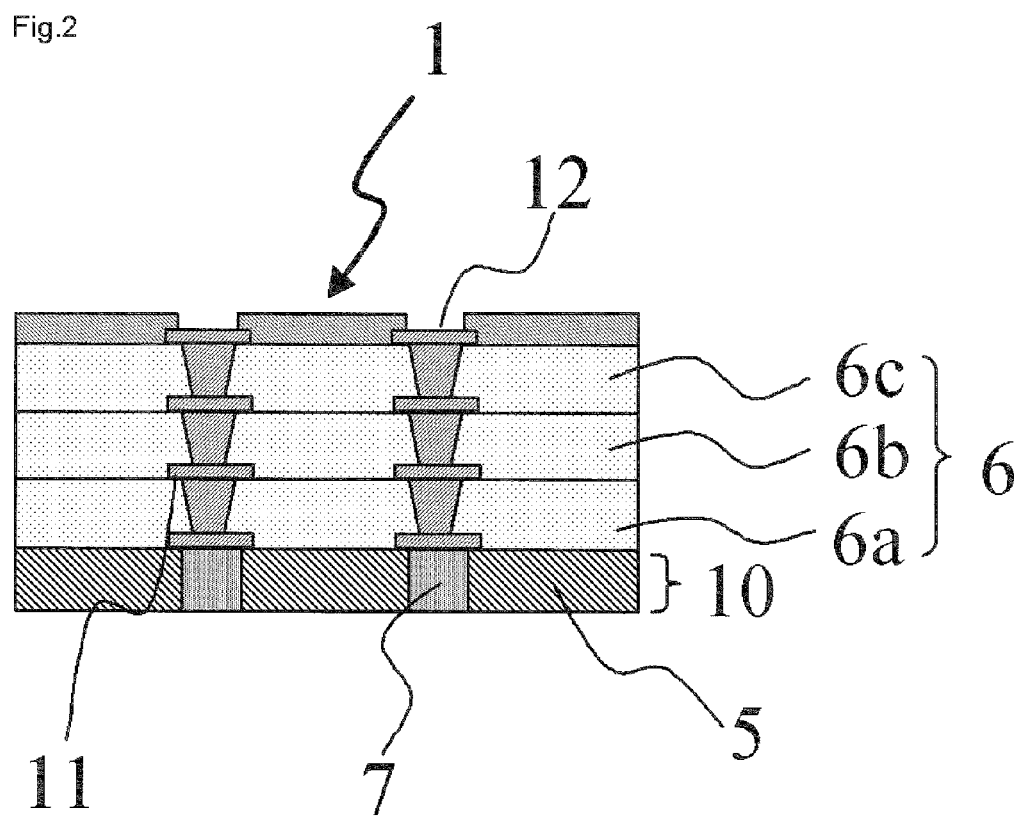
FIG. 2 is a cross-sectional view illustrating an insulating layer in a part of a semiconductor package structure of the present invention in detail.

FIG. 2 shows a three-layer interlayer insulating layer 6 in detail. In other words, on one side of the inner circuit board 10 (the side on which a semiconductor chip 2 is mounted) are laminated a conductor circuit layer 11 and an interlayer insulating layer 6*a* as a first layer, a conductor circuit layer 11 and an interlayer insulating layer 6*b* as a second layer and a conductor circuit layer 11 and an interlayer insulating layer 6*c* as a third layer. The interlayer insulating layer 6*a*, the interlayer insulating layer 6*b* and the interlayer insulating layer 6*c* may have a different elastic modulus. In an exemplary lamination structure, the interlayer insulating layer 6*a* and the interlayer insulating layer 6*c* can have an equal elastic modulus while the interlayer insulating layer 6*b* can have a different elastic modulus, or the interlayer insulating layer 6*a* and the interlayer insulating layer 6*b* can have an equal elastic modulus while the interlayer insulating layer 6*c* can have a different elastic modulus, and all of these lamination structures may have an equal elastic modulus as the whole interlayer insulating layer 6.

The same holds for the other side of the inner circuit board 10. That is, since the equal number of the interlayer insulating layers 6 are laminated over and underneath the core layer 5, the interlayer insulating layers 6 are formed in a line symmetric manner around the core layer 5. Here, the interlayer insulating layer 6 which are in the relation of line symmetry around the core layer 5 preferably have an equal elastic modulus. More preferably, the interlayer insulating layers 6 are laminated over and underneath of the core layer 5, and the interlayer insulating layers 6 which are in the relation of line symmetry around the core layer 5 have the same lamination structure. Thus, warpage of the overall multilayer circuit board 1 can be further minimized.

The number of the conductor circuit layers 11 or the interlayer insulating layers 6 is not limited to the above number, but can be appropriately determined, depending on the number of signal wirings, the interconnection pattern and the like. Alternatively, the conductor circuit layers 11 and the interlayer insulating layers 6 can be formed on one side of the inner circuit board 10.

The conductor circuit layers 11 and the interlayer insulating layers 6 are formed by piling the conductor circuit layers 11 and the interlayer insulating layers 6 on one side or both sides of the inner circuit board 10 and then heating them. Specifically, the conductor circuit layers 11 and the interlayer insulating layers 6 are piled with the inner circuit board 10, and the product is pressed with heating under vacuum using, for example, a vacuum pressing laminator and then cured by heating it using a hot-air dryer.

There are no particular restrictions to the conditions of, which can be conducted, for example, at a temperature of 60 to 160° C. and a pressure of 0.2 to 3 MPa. Furthermore, there are no particular restrictions to the curing by heating, which can be conducted, for example, at a temperature of 140 to 240° C. for a period of 30 to 120 min. Alternatively, the insulating resin in the above interlayer insulating layer 6 can be piled on the inner circuit board 10 and they can be pressed with heating using, for example, a flat press. There are no particular restrictions to the conditions of the pressing with heating, which can be conducted, for example, at a temperature of 140 to 240° C. and a pressure of 1 to 4 MPa.

The plurality of the conductor circuit layers 11 are laminated in the order of the interlayer insulating layer 6 and the conductor circuit layer 11, and a stacked via 8 electrically connect the conductor circuit layers 11 in the separate layers, to form a multilayer wiring structure consisting of the plurality of the conductor circuit layers 11 and the interlayer insulating layers 6. The plurality of the conductor circuit layers 11 and the interlayer insulating layers 6 can be formed by applying an additive method such as a semi-additive method and a full-additive method. In accordance with a semi-additive method, the conductor circuit layer 11 and the interlayer insulating layer 6 are formed on both sides of the inner circuit board 10, and then a via hole is formed in the conductor circuit layer 11 and the interlayer insulating layer 6 by, for example, laser processing. The surface of the conductor circuit layer 11 and the interlayer insulating layer 6 including the inside of the via hole are, for example, sequentially processed by nonelectrolytic copper plating and then electrolytic copper plating, to form the stacked via 8 and the conductor circuit layer 11. After the nonelectrolytic plating, superheating can be conducted for improving adhesiveness of copper to the interlayer insulating layer 6. Such a process for forming the interlayer insulating layer 6 and the conductor circuit layer 11 (including the stacked via) are repeated multiple times, depending on the number of laminated layers.

An electrode pad 12 connected to an internal wiring formed by the conductor circuit layers 11, the stacked via 8 and the through-hole 7 is formed in the side on which the semiconductor chip 2 is mounted, in the multilayer circuit board 1 having the conductor circuit layers 11 and the interlayer insulating layers 6. On the other hand, an external connecting terminal 9 connected to the internal wiring is formed in the side opposite to the side on which the semiconductor chip 2 is mounted, in the multilayer circuit board 1. The electrode pad 12 is electrically connected to the external connecting terminal 9 via the internal wiring formed by the conductor circuit layers 11, the stacked via 8 and the through-hole 7. The external connecting terminal 9 can be a metal terminal such as a solder bump and an Au bump.

Another embodiment of the multilayer circuit board 1 is a coreless substrate without a core layer 5. It is different from the above multilayer circuit board 1, in that the core layer 5 is replaced by a base board with a peelable foil, on which an interlayer insulating layer 6 and a conductor circuit layer 11 are formed. The process can be repeated to form a required number of the layers. The interlayer insulating layer 6 and the conductor circuit layer 11 can be formed as described for the multilayer circuit board 1. At the end of the lamination, the baseboard is peeled off at the peelable copper foil. The peelable copper foil remaining in the side of the multilayer circuit board 1 can be etched off to give a coreless multilayer circuit board 1. The coreless multilayer circuit board 1 can undergo interlayer connection, surface processing and terminal formation as described for the above multilayer circuit board 1.

<Semiconductor Package>

There will be described a flip-chip semiconductor package in FIG. 1.

One embodiment of the present invention has the bonding step where the electrode side for connecting the semiconductor chip 2 in the multilayer circuit board 1 is flip-chip bonded to the electrode side of the semiconductor chip 2 via the metal bump 3, and the sealing step where a sealant resin composition 4 is applied between the multilayer circuit board 1 and the semiconductor chip 2 to form an underfill.

In the sealing step, while the sealant resin composition 4 and the semiconductor package having the multilayer circuit board 1 and the semiconductor chip 2 which are flip-chip bonded via the metal bump 3 before applying the sealant resin composition 4 are heated, the sealant resin composition 4 is applied to the side edge of the semiconductor chip 2 to fill a gap by capillary action, and for shortening a production cycle, inclination of a semiconductor package, acceleration of composition application utilizing a pressure difference and the like can be combined.

After filling or applying the sealant resin composition 4 as described above, the sealant resin composition 4 is cured at a temperature in the range of 100° C. to 170° C. for 1 to 12 hours. Here, a curing temperature profile can be changed; for example, heat curing can be conducted by a stepwise temperature change of 100° C. for 1 hour and then 150° C. for 2 hours.

As a sealant, the sealant resin composition 4 desirably has a viscosity of 50 Pa·sec or less (25° C.). A viscosity of the sealant resin composition 4 during application is desirably 2 Pa·sec or less. A temperature during application is 60 to 140° C., more preferably 100 to 120° C.

EXAMPLES

The present invention will be described with Document to, but not limited to, Examples.

1. Physical Property Test for a Cured Product of a Material Used for an Insulating Layer The following materials were used for an insulating layer.

(1) Preparation of a Resin Varnish

A material for the first insulating layer having a lower elastic modulus was prepared as follows. In methyl ethyl ketone were dissolved and dispersed 49.7 parts by weight of a biphenyldimethylene type epoxy resin (Nippon Kayaku Co., Ltd., NC-3000, epoxy equivalent: 275, weight average molecular weight: 2000), 10 parts by weight of a copolymer of a phenoxy resin/a biphenyl epoxy resin with a bisphenol-S epoxy resin, having a terminal epoxy group (Japan Epoxy Resins Co., Ltd., YX-8100H30, weight average molecular weight: 30000) and 0.1 parts by weight of an imidazole compound (Shikoku Chemicals Corporation, Curesol 1B2PZ (1-benzyl-2-phenylimidazole)). To the mixture were further added 40 parts by weight of an inorganic filler/spherical fused silica (Admatechs Co., Ltd., SO-25R, average particle size: 0.5 μm) and 0.2 parts by weight of a coupling agent/epoxysilane coupling agent (GE TOSHIBA SILICONE CO., LTD., A-187), and the mixture was stirred for 10 min using a high-speed stirrer, to prepare a resin varnish (a) with a solid content of 50% by weight.

A material for the second insulating layer having a higher elastic modulus was prepared as follows. In methyl ethyl ketone were dissolved and dispersed 25 parts by weight of a novolac type cyanate resin (Lonza Japan Ltd., Primaset PT-30, weight average molecular weight: about 700), 24.7 parts by weight of a biphenyldimethylene type epoxy resin (Nippon Kayaku Co., Ltd., NC-3000, epoxy equivalent: 275, weight average molecular weight: 2000), 10 parts by weight of a copolymer of a phenoxy resin/a biphenyl epoxy resin with a bisphenol-S epoxy resin having a terminal epoxy group (Japan Epoxy Resins Co., Ltd., YX-8100H30, weight average molecular weight 30000) and 0.1 parts by weight of an imidazole compound (Shikoku Chemicals Corporation, Curesol 1B2PZ (1-benzyl-2-phenylimidazole)). To the mixture were further added 40 parts by weight of an inorganic filler/spherical fused silica (Admatechs Co., Ltd., SO-25R, average particle size: 0.5 μm) and 0.2 parts by weight of a coupling agent/an epoxysilane coupling agent (GE TOSHIBA SILICONE CO., LTD., A-187), and the mixture was stirred for 10 min using a high-speed stirrer, to prepare a resin varnish (b) with a solid content of 50% by weight.

(2) Preparation of a Material for an Insulating Layer

Each of the resin varnishes obtained above was applied on one side of a PET (polyethylene terephthalate) film with a thickness of 25 μm using a comma coater such that the resin layer after drying was to have a predetermined thickness, and the film was then dried in an oven at 160° C., to prepare an insulating layer. The insulating layers thus prepared were called a first insulating layer (a) and a second insulating layer (b), respectively.

<Glass Transition Temperature and Elastic Modulus>

From the first insulating layer (a) or the second insulating layer (b) prepared above, an insulating layer with a thickness of 80 μm was prepared using an atmospheric pressure laminator, and was cured at 200° C. for 2 hours. From the resin cured product, a 5 mm×30 mm test piece was taken as an evaluation sample. Using a dynamic viscoelastic measurement apparatus (DMA) (Seiko Instruments Inc., DMS6100), a dynamic viscoelasticity was measured at a temperature increase rate of 5° C./min while applying distortion at a frequency of 10 Hz, and a glass transition temperature (Tg) was determined from a peak value of tan δ and from the measurement, an elastic modulus at 25° C. was determined.

<Linear Expansion Coefficient>

From the resin cured product obtained above, a 4 mm×20 mm piece was taken as an evaluation sample.

Using a TMA apparatus (TMA) (TA Instruments), the sample was measured at a temperature increase rate of 10° C./min and a linear expansion coefficient at a glass transition temperature or lower was calculated.

TABLE 1

|  | Glass transition temperature [° C.] | Elastic modulus [GPa] | Linear expansion coefficient [ppm/° C.] |
| --- | --- | --- | --- |
| First insulating layer (a) | 150 | 1 | 50 |
| Second insulating layer (b) | 220 | 5 | 32 |

2. Configuration of a Multilayer Circuit Board

The above insulating layer was used to prepare a multilayer circuit board for evaluation by a semi-additive process. This multilayer circuit board for evaluation was a multilayer circuit board having 8 conductor circuits in which three insulating layers and three conductor circuit layers were laminated on each side of a core material (Sumitomo Bakelite Co., Ltd., Sumilite ELC-4785GS 0.20 mmt). The internal wiring had a through-hole in the core layer; three-tier stacked vias are formed in both sides of the through-hole; the internal wiring had a structure that the electrode pad in the surface on which the semiconductor chip was to be mounted and the stacked vias formed in both sides of the through-hole are linearly connected; the size of the multilayer circuit board was 50 mm×50 mm; the above electrode pad was Ni/Au-plated; and the electrode pad to be flip-chip connected was treated with a presolder (tin: 96.5%, silver: 3%, and copper: 0.5%).

With the above configuration, multilayer circuit boards A, B, C, D and F were prepared.

In the multilayer circuit board A, the interlayer insulating layer was a first insulating layer having a lower elastic modulus and a second insulating layer having a higher elastic modulus. Specifically, using the resin varnishes (a) and (b) prepared above, a first insulating layer having a lower elastic modulus with a thickness of 10 μm and a second insulating layer having a higher elastic modulus with a thickness of 20 μm were separately formed on a PET film, and in a build-up process between circuit layers, the first insulating layer (a) having a lower elastic modulus, the second insulating layer (b) having a higher elastic modulus and the first insulating layer (a) having a lower elastic modulus were laminated in sequence. This interlayer insulating layer was used as an interlayer insulating layer (1) (a first interlayer insulating layer). On this interlayer insulating layer (1), a conductor circuit layer was formed and then interlayer insulating layers (1) and conductor circuit layers were formed to produce a multilayer circuit board having 8 conductor circuit layers. The total thickness of the multilayer circuit board was 0.69 mm.

The multilayer circuit board B was prepared using the interlayer insulating layer (1) prepared for the multilayer circuit board A and an interlayer insulating layer (2) (a second interlayer insulating layer) with a thickness of 40 μm consisting of the second insulating layer (b) having a higher elastic modulus alone as described for the multilayer circuit board A. Using the resin varnish (b) prepared above, the interlayer insulating layer (2) with a thickness of 40 μm was formed on a PET film, and in a build-up process between circuit layers, on each of the upper and the lower sides of the core layer, one interlayer insulating layer (1) was formed and on each of the upper and the lower sides of the interlayer insulating layer (1), two interlayer insulating layers (2) were formed. A total thickness of the multilayer circuit board was 0.69 mm.

The multilayer circuit board C was prepared as described for the multilayer circuit board B, where using the interlayer insulating layer (1) and the interlayer insulating layer (2) as described for the multilayer circuit board B, on each of the upper and the lower sides of the core layer 5, two interlayer insulating layers (2) were formed and on each of the upper and the lower sides of the interlayer insulating layer (2), one interlayer insulating layer (1) was formed. A total thickness of the multilayer circuit board was 0.69 mm.

The multilayer circuit board D was prepared as described for the multilayer circuit board B, where using the interlayer insulating layer (1) and the interlayer insulating layer (2) as described for the multilayer circuit board B, on each of the upper and the lower sides of the core layer 5, one interlayer insulating layer (2) was formed and on each of the upper and the lower sides of the interlayer insulating layer (2), two interlayer insulating layers (1) were formed. A total thickness of the multilayer circuit board was 0.69 mm.

The multilayer circuit board F was prepared as described for the multilayer circuit board A, using the interlayer insulating layer (2) with a thickness of 40 μm alone as an insulating layer. A total thickness of the multilayer circuit board was 0.69 mm.

The multilayer circuit board E was prepared as a multilayer circuit board without a core layer by a semi-additive method. Specifically, a double-sided plate having a total thickness of 0.8 mm on both sides of which a peelable copper foil YSNAP (Nippon Denkai, Ltd.) was attached (Sumitomo Bakelite Co., Ltd., Sumilite ELC-4785GS) was used as a base board, on one side of which the interlayer insulating layer (1) described above was formed as an insulating layer by a build-up process. Then, on the interlayer insulating layer (1) was formed a conductor circuit layer, and the process was repeated 6 times to provide a multilayer structure. Finally, the base board was peeled off at the peelable copper foil and the remaining peelable copper layer in the side having the multilayer circuit board was etched off to give the multilayer circuit board E. A total thickness of the multilayer circuit board was 0.4 mm.

The multilayer circuit board G was prepared as described for the multilayer circuit board E, substituting the interlayer insulating layer (2) for the interlayer insulating layer (1) for the above multilayer circuit board E.

3. Configuration of a Semiconductor Package

Using the multilayer circuit boards A to G thus prepared, semiconductor packages A to G were prepared by flip-chip mounting. On the board was flip-chip mounted a semiconductor chip with a semiconductor chip size of 15 mm×15 mm, a semiconductor chip thickness of 725 μm, a bump size of 100 μm and a bump pitch of 200 μm, and an underfill material was Sumiresin Excel CRP-4160 (from Sumitomo Bakelite Co., Ltd.).

4. Warpage Evaluation

Using a laser three-dimensional shape measuring instrument (Hitachi Technologies and Services, Ltd., LS220-MT), warpage at an ambient temperature was measured for the multilayer circuit boards A to G and the semiconductor packages A to G prepared above, and the results are shown as Examples 1 to 5 and Comparative Examples 1 to 2 in Table 2. A measurement area was 15 mm×15 mm which was identical with the size of the semiconductor chip, and the measurement was conducted while the BGA surface opposite to the surface with the semiconductor chip was lased, and a difference in a distance from the laser head between the most distant and the closest points was calculated as a warpage value.

TABLE 2

|  |  | Example | | | | | Comparative Example | |
|---|---|---|---|---|---|---|---|---|
|  |  | 1 | 2 | 3 | 4 | 5 | 1 | 2 |
| Core layer | | Present | Present | Present | Present | Absent | Present | Absent |
| Configuration of one insulating layer (Interlayer insulating layer) | | 3 layers | 3 layers 1 layer | 3 layers 1 layer | 3 layers 1 layer | 3 layers | 1 layer | 1 layer |
| Eb/Ea | | 5 | 5 | 5 | 5 | 5 | — | — |
| Eb [GPa] | | 5 | 5 | 5 | 5 | 5 | — | — |
| Multilayer circuit board | Configuration | A | B | C | D | E | F | G |
|  | Warpage evaluation | ○ | ○ | ○ | ○ | ○ | x | x |
| Semiconductor package | Configuration | A | B | C | D | E | F | G |
|  | Warpage evaluation | ○ | ○ | ○ | ○ | ○ | x | x |

—: No data
○: Warpage of less than 60 μm
x: Warpage of 60 μm or more

As indicated from the above results, by using a plurality of insulating layers having a different elastic modulus as an interlayer insulating layer, the properties of the interlayer insulating layer in a multilayer circuit board are modified to improve warpage of the whole multilayer circuit board and warpage of a semiconductor package. It allows for improving an yield of mounting a semiconductor chip and improving reliability of a semiconductor package.

This application claims priority from Japanese Patent Application No. 2008-092028, filed on Mar. 31, 2008, the disclosure of which is hereby incorporated by Document.

The invention claimed is:

1. A multilayer circuit board comprising:
a plurality of conductor circuit layers, each of said plurality of conductor circuit layers being arranged substantially in parallel to one another; and
an interlayer insulating layer interposed between two adjacent conductor circuit layers of said plurality of conductor layers,
said interlayer insulating layer comprising:
a plurality of first insulating layers; and
a second insulating layer having an elastic modulus higher than an elastic modulus of said first insulating layer, and being interposed between two of said plurality of first insulating layers.

2. The multilayer circuit board as claimed in claim 1, wherein
said multilayer circuit board comprises a plurality of said interlayer insulating layers; and
said interlayer insulating layers have an identical elastic modulus.

3. The multilayer circuit board as claimed in claim 2, wherein
said interlayer insulating layers are laminated in an identical lamination structure.

4. The multilayer circuit board as claimed in claim 1, wherein
the multilayer circuit board comprises a plurality of said interlayer insulating layers; and
said interlayer insulating layers are laminated in a lamination structure comprising a first interlayer insulating layer consisting of said first insulating layer, said second insulating layer and said first insulating layer which are sequentially laminated, and
a second interlayer insulating layer consisting of said second insulating layers.

5. The multilayer circuit board as claimed in claim 1, wherein
said interlayer insulating layer is made of a resin composition comprising a cyanate resin.

6. The multilayer circuit board as claimed in claim 5, wherein
said cyanate resin is a novolac-type cyanate resin.

7. The multilayer circuit board as claimed in claim 1, wherein
said multilayer circuit board further comprises a core layer;
said interlayer insulating layers are laminated over and underneath said core layer; and
said interlayer insulating layers being line-symmetric around said core layer are laminated in an identical lamination structure.

8. The multilayer circuit board as claimed in claim 1, wherein when elastic moduli of said first insulating layer and said second insulating layer are Ea and Eb, respectively, (Eb/Ea)>3.

9. The multilayer circuit board as claimed in claim 1, wherein when Eb is an elastic modulus of said second insulating layer as determined by dynamic viscoelastic measurement at a frequency of 10 Hz, (Eb)≥4 GPa.

10. The multilayer circuit board as claimed in claim 1, wherein when Ea is an elastic modulus of said first insulating layer as determined by dynamic viscoelastic measurement at a frequency of 10 Hz, (Ea)≤2 GPa.

11. A semiconductor package comprising the multilayer circuit board as claimed in claim 1.

12. An insulating sheet constituting an interlayer insulating layer used for a multilayer circuit board in which the interlayer insulating layer interposed between two adjacent conductor circuit layers, said interlayer insulating layer comprising:

a plurality of first insulating layers; and a second insulating layer having an elastic modulus higher than an elastic modulus said first insulating layer, and being interposed between two of said plurality of first insulating layers.

13. The insulating sheet as claimed in claim 12, wherein said interlayer insulating layer is made of a resin composition comprising a cyanate resin.

14. The insulating sheet as claimed in claim 13, wherein said cyanate resin is a novolac-type cyanate resin.

15. The insulating sheet as claimed in claim 12, wherein, when elastic moduli of said first insulating layer and said second insulating layer are Ea and Eb, respectively, (Eb/Ea)>3.

16. The insulating sheet as claimed in claim 12, wherein when Eb is an elastic modulus of said second insulating layer as determined by dynamic viscoelastic measurement at a frequency of 10 Hz, (Eb)≥4 GPa.

17. The insulating sheet as claimed in claim 12, wherein when Ea is an elastic modulus of said first insulating layer as determined by dynamic viscoelastic measurement at a frequency of 10 Hz, (Ea)≤2 GPa.

* * * * *